US010686134B2

United States Patent
Arai et al.

(10) Patent No.: US 10,686,134 B2
(45) Date of Patent: *Jun. 16, 2020

(54) PHOTOELECTRIC CONVERSION ELEMENT

(71) Applicant: RICOH COMPANY, LTD., Tokyo (JP)

(72) Inventors: Ryota Arai, Shizuoka (JP); Yuuji Tanaka, Shizuoka (JP); Tsuyoshi Matsuyama, Shizuoka (JP); Tokushige Kino, Shizuoka (JP); Naomichi Kanei, Shizuoka (JP)

(73) Assignee: RICOH COMPANY, LTD., Tokyo (JP)

( * ) Notice: Subject to any disclaimer, the term of this patent is extended or adjusted under 35 U.S.C. 154(b) by 34 days.

This patent is subject to a terminal disclaimer.

(21) Appl. No.: 15/414,410

(22) Filed: Jan. 24, 2017

(65) Prior Publication Data

US 2017/0222150 A1 Aug. 3, 2017

(30) Foreign Application Priority Data

Jan. 28, 2016 (JP) .................................. 2016-014608
Jul. 14, 2016 (JP) .................................. 2016-139074

(51) Int. Cl.
*H01L 51/00* (2006.01)
*H01L 51/42* (2006.01)

(52) U.S. Cl.
CPC ...... *H01L 51/0047* (2013.01); *H01L 51/0068* (2013.01); *H01L 51/0074* (2013.01); *H01L 51/4253* (2013.01); *Y02E 10/549* (2013.01)

(58) Field of Classification Search
CPC ............ H01L 51/0036; H01L 51/0047; H01L 51/42–448

See application file for complete search history.

(56) References Cited

U.S. PATENT DOCUMENTS

| 10,062,854 | B2 * | 8/2018 | Arai | ..................... C07D 495/04 |
| 2008/0264488 | A1 * | 10/2008 | Balasubramanian | .. B82Y 10/00 136/263 |
| 2016/0126462 | A1 * | 5/2016 | Nagai | ................ H01L 51/0047 252/500 |

FOREIGN PATENT DOCUMENTS

| CN | 103788111 A * | 5/2014 |
| JP | 1-220380 | 9/1989 |
| JP | 2013-077760 | 4/2013 |
| JP | 2014-177409 | 9/2014 |

(Continued)

OTHER PUBLICATIONS

S. Shen et al., "Solution-processable organic molecule photovoltaic materials with bithienyl-benzodithiophene central unit and indenedione end groups", Chemistry of Materials 25, p. 2274-2281. (Year: 2013).*

(Continued)

*Primary Examiner* — Eric R Smith
(74) *Attorney, Agent, or Firm* — Oblon, McClelland, Maier & Neustadt, L.L.P.

(57) ABSTRACT

A photoelectric conversion element is provided. The photoelectric conversion element includes a conductive film, an electron transport layer overlying the conductive film, a photoelectric conversion layer overlying the electron transport layer, a hole transport layer overlying the photoelectric conversion layer, and an electrode. The photoelectric conversion layer includes a first material and a second material, each having specific chemical formulae.

6 Claims, 1 Drawing Sheet

(56) References Cited

FOREIGN PATENT DOCUMENTS

| JP | 2014-218492 | 11/2014 | | |
|---|---|---|---|---|
| JP | 2016-127160 | 7/2016 | | |
| WO | WO-2014185535 A1 | * | 11/2014 | ............... C08K 3/04 |
| WO | WO-2015073542 A1 | * | 5/2015 | ......... H01L 51/0004 |

OTHER PUBLICATIONS

Y. Sun et al., "Inverted polymer solar cells integrated with a low-temperature-annealed sol-gel-derived ZnO film as an electron transport layer", Advanced Materials 23, p. 1679-1683. (Year: 2011).*

Machine translation of CN103788111A (Year: 2014).*

R. Ganesamoorthy, et al., "Review: Fullerene based acceptors for efficient bulk heterojunction organic solar cell applications", Solar Energy Materials & Solar Cells 161, p. 102-148 (Year: 2017).*

C. L. Cutting, et al., "Indoor light recycling: a new home for organic photovoltaics", Journal of Materials Chemistry C 4, p. 10367-10370 (Year: 2016).*

Brian O'Regan, et al., "A low-cost, high-efficiency solar cell based on dye-sensitized colloidal TiO2 films," *Nature*, vol. 353, pp. 737-740 (Oct. 24, 1991).

M. K. Nazeeruddin, et al., "Conversion of Light to Electricity by cis-X2Bis( 2,2'-bipyridyl-4,4'-dicarboxylate)ruthenium(II) Charge-Transfer Sensitizers (X=Cl-, Br-, I-, CN-, and SCN-) on Nanocrystalline TiO2 Electrodes," *J. Am. Chem. Soc.* 1993,115, pp. 6382-6390.

Takashi Sekiguchi, et al., "Improvement of Durability of Dye-Sensitized Solar Cells for Indoor Applications," *Panasonic Electric Works technical report*, vol. 56, No. 4, pp. 87-92.

K Tennakone, et al., "A dye-sensitized nano-porous I solid-state photovoltaic cell," *Semicond. Sci. Technol.* 10 (1995) pp. 1689-1693.

Todori Kenji, Hosoya Masahiro, and Saito Mitsunaga, "Organic Photovoltaics Offering Various Power Supply Applications", *Toshiba Review*, vol. 69, No. 6 (2014), pp. 36-39, along with a partial English translation.

Seung Hun Eom, et al., "Roles of Interfacial Modifiers in Hybrid Solar Cells: Inorganic/Polymer Bilayer vs Inorganic/Polymer:Fullerene Bulk Heterojunction", ACS Applied Materials & Interfaces, vol. 6, No. 2, (2014), pp. 803-810.

* cited by examiner

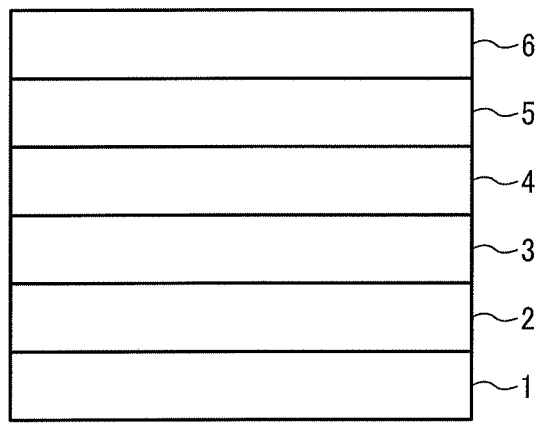

PHOTOELECTRIC CONVERSION ELEMENT

CROSS-REFERENCE TO RELATED APPLICATIONS

This patent application is based on and claims priority pursuant to 35 U.S.C. § 119(a) to Japanese Patent Application Nos. 2016-014608 and 2016-139074, filed on Jan. 28, 2016 and Jul. 14, 2016, respectively, in the Japan Patent Office, the entire disclosure of each of which is hereby incorporated by reference herein.

BACKGROUND

Technical Field

The present disclosure relates to a photoelectric conversion element.

Description of the Related Art

Electronic circuits became able to be driven with very small electric power lately. For example, various electronic parts, such as sensors, can be driven with very small electric power (in μW order), prepared for upcoming Internet of Things (IoT) society. In particular, environmental power generating elements that generate and consume power on the spot are expected as stand-alone power sources for driving sensors. Among environmental power generating elements, photoelectric conversion elements that can generate power wherever light exists are attracting attention. Photoelectric conversion elements are demanded to effectively generate power even with weak light emitted from, for example, an LED (light emitting diode) lamp or a fluorescent lamp. Such weak light is generally called indoor light since it is generally emitted indoor. The illuminance of indoor light is about 20 to 1,000 lux, which is significantly weaker than that of direct sunlight (i.e., about 100,000 lux). Thus, environmental power generating elements are demanded to effectively generate power even with indoor light that may be emitted from an LED lamp or a fluorescent lamp.

Since photoelectric conversion elements are more sensitive to heat and light under low-illuminance light such as indoor light compared to sunlight, there is a need for photoelectric conversion elements with improved heat resistance and light resistance.

SUMMARY

In accordance with some embodiments of the present invention, a photoelectric conversion element is provided. The photoelectric conversion element includes a conductive film, an electron transport layer overlying the conductive film, a photoelectric conversion layer overlying the electron transport layer, a hole transport layer overlying the photoelectric conversion layer, and an electrode. The photoelectric conversion layer includes a first material and a second material. The first material is represented by the following formula (1):

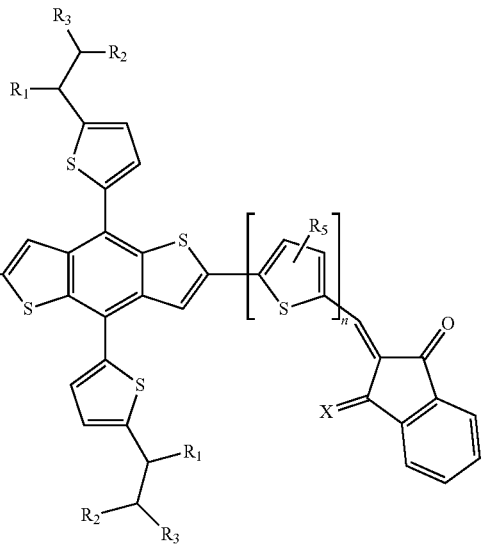

Formula (1)

wherein $R_1$ represents a hydrogen atom or a straight-chain or branched-chain alkyl group having 2 to 6 carbon atoms; each of $R_2$ and $R_3$ independently represents a straight-chain or branched-chain alkyl group having 2 to 12 carbon atoms; each of $R_4$ and $R_5$ independently represents a straight-chain or branched-chain alkyl group having 6 to 12 carbon atoms; X represents an oxygen atom or dicyanomethylene group; and n represents an integer of from 1 to 3. The second material is represented by the following formula (2);

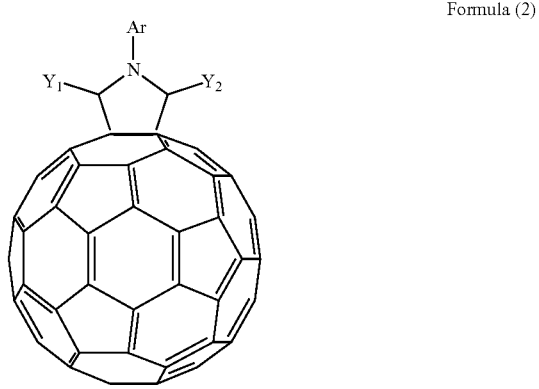

Formula (2)

wherein each of $Y_1$ and $Y_2$ independently represents a hydrogen atom, an alkyl group, an alkenyl group, an alkynyl group, an aryl group, or an aralkyl group, but each of $Y_1$ and $Y_2$ does not represent a hydrogen atom at the same time; Ar represents an aryl group; and a structural unit represented by the following formula (F) is a fullerene skeleton having 60 carbon atoms.

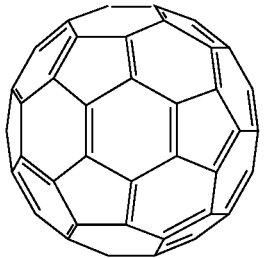

Formula (F)

BRIEF DESCRIPTION OF THE DRAWING

A more complete appreciation of the disclosure and many of the attendant advantages thereof will be readily obtained as the same becomes better understood by reference to the following detailed description when considered in connection with the accompanying drawing, which is intended to depict example embodiments of the present invention and should not be interpreted to limit the scope thereof. The accompanying drawing is not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Embodiments of the present invention are described in detail below with reference to accompanying drawings. In describing embodiments illustrated in the drawings, specific terminology is employed for the sake of clarity. However, the disclosure of this patent specification is not intended to be limited to the specific terminology so selected, and it is to be understood that each specific element includes all technical equivalents that have a similar function, operate in a similar manner, and achieve a similar result.

For the sake of simplicity, the same reference number will be given to identical constituent elements such as parts and materials having the same functions and redundant descriptions thereof omitted unless otherwise stated.

Within the context of the present disclosure, if a first layer is stated to be "overlaid" on, or "overlying" a second layer, the first layer may be in direct contact with a portion or all of the second layer, or there may be one or more intervening layers between the first and second layer, with the second layer being closer to the substrate than the first layer.

In the present disclosure, photoelectric conversion elements refer to either elements that convert optical energy into electric energy or elements that convert electric energy into optical energy. Specific examples of the photoelectric conversion elements include solar cell and photodiodes.

In accordance with some embodiments of the present invention, a photoelectric conversion element having superior heat resistance and light resistance is provided.

A photoelectric conversion element according to an embodiment of the present invention is illustrated in the accompanied drawing.

Referring to the drawing, the photoelectric conversion element includes, from the innermost side thereof, a substrate 1, a conductive film 2, an electron transport layer 3, a photoelectric conversion layer 4, a hole transport layer 5, and an electrode 6.

Details for each layer are described below.

Photoelectric Conversion Layer

The photoelectric conversion layer includes a first material represented by the formula (1) and a second material represented by the formula (2).

Preferably, the weight ratio of the first material to the second material is in the range of from 35/65 to 80/20, more preferably from 40/60 to 75/25, and most preferably from 50/50 to 70/30. When the weight ratio is within the above range, the photoelectric conversion element can provide enhanced performance.

Preferably, the photoelectric conversion layer has an average thickness of from 50 to 400 mm, more preferably from 60 to 250 nm. When the average thickness is 50 nm or greater, the photoelectric conversion layer absorbs light only slightly, thus generating sufficient carriers. When the average thickness is 400 nm or less, the transport efficiency of the carriers generated by light absorption does not deteriorate.

First Material

The first material is represented by the formula (1). In the formula (1), $R_1$ represents a hydrogen atom or a straight-chain or branched-chain alkyl group having 2 to 6 carbon atoms, such as ethyl group, propyl group, butyl group, pentyl group, and hexyl group. Preferably, $R_1$ is a hydrogen atom.

$R_2$ represents a straight-chain or branched-chain alkyl group having 2 to 12 carbon atoms, such as ethyl group, propyl group, butyl group, pentyl group, hexyl group, octyl group, and decyl group. Preferably, $R_2$ is ethyl group.

$R_3$ represents a straight-chain or branched-chain alkyl group having 2 to 12 carbon atoms, such as ethyl group, propyl group, butyl group, pentyl group, hexyl group, octyl group, and decyl group. Preferably, $R_3$ is butyl group.

Each of $R_4$ and $R_5$ independently represents a straight-chain or branched-chain alkyl group having 6 to 12 carbon atoms, such as ethyl group, propyl group, butyl group, pentyl group, hexyl group, and octyl group. Preferably, each of $R_4$ and $R_5$ is hexyl group.

Specific examples of the first material include, but are not limited to, example compounds 1 to 14 described below.

Example Compound 1
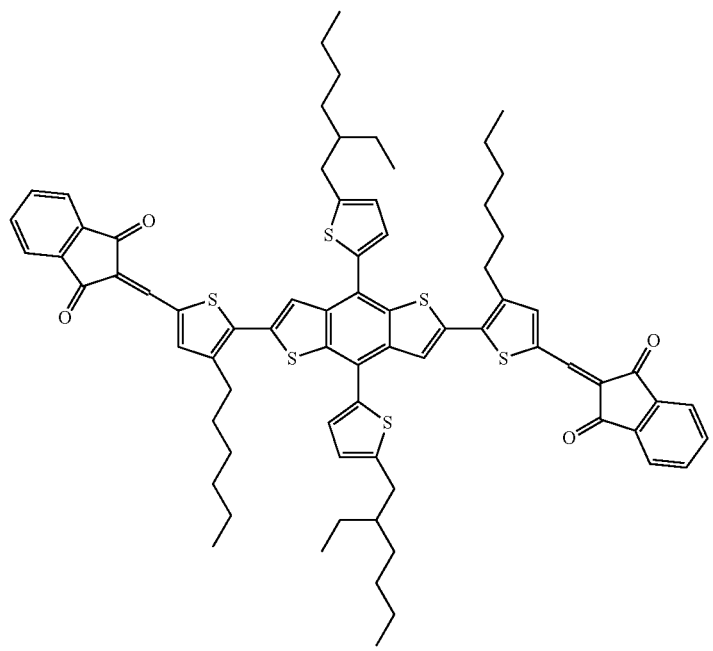
Example Compound 2
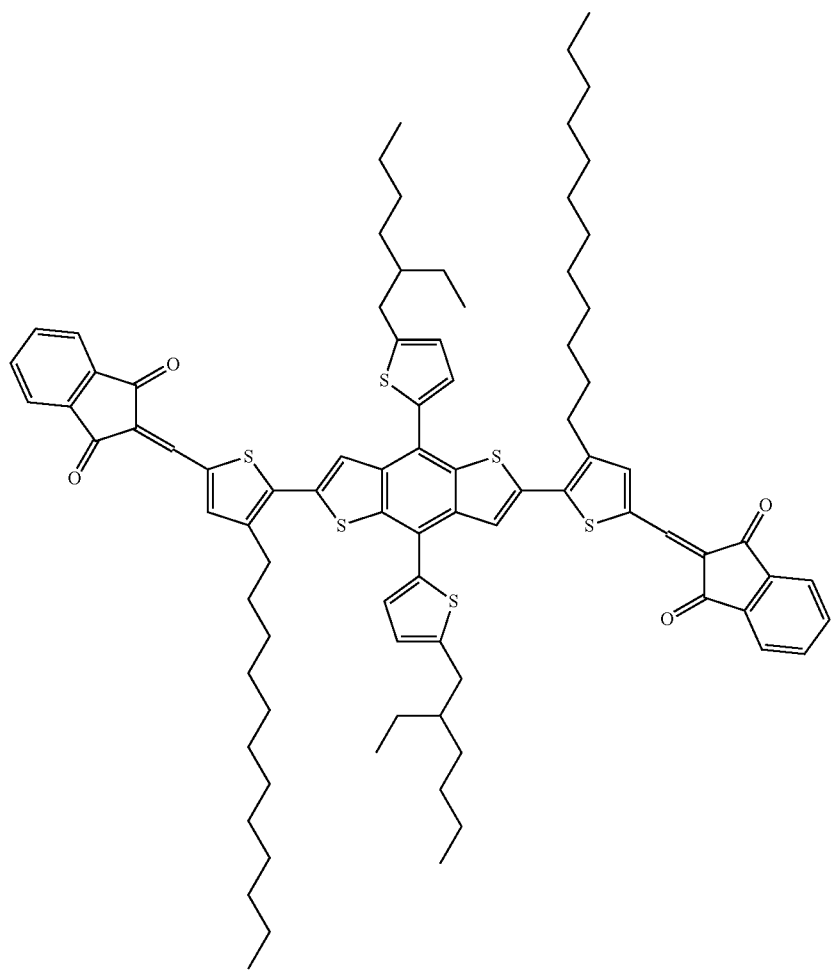

Example Compound 3
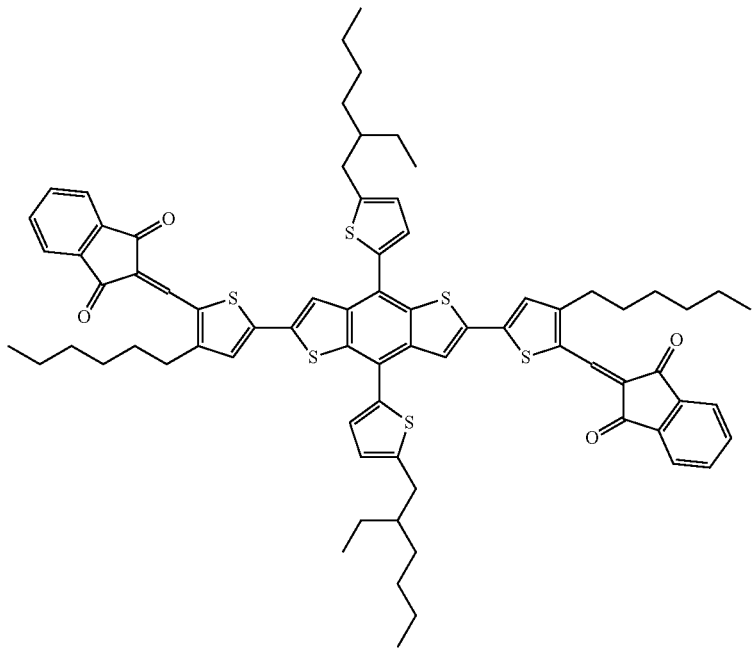
Example Compound 4
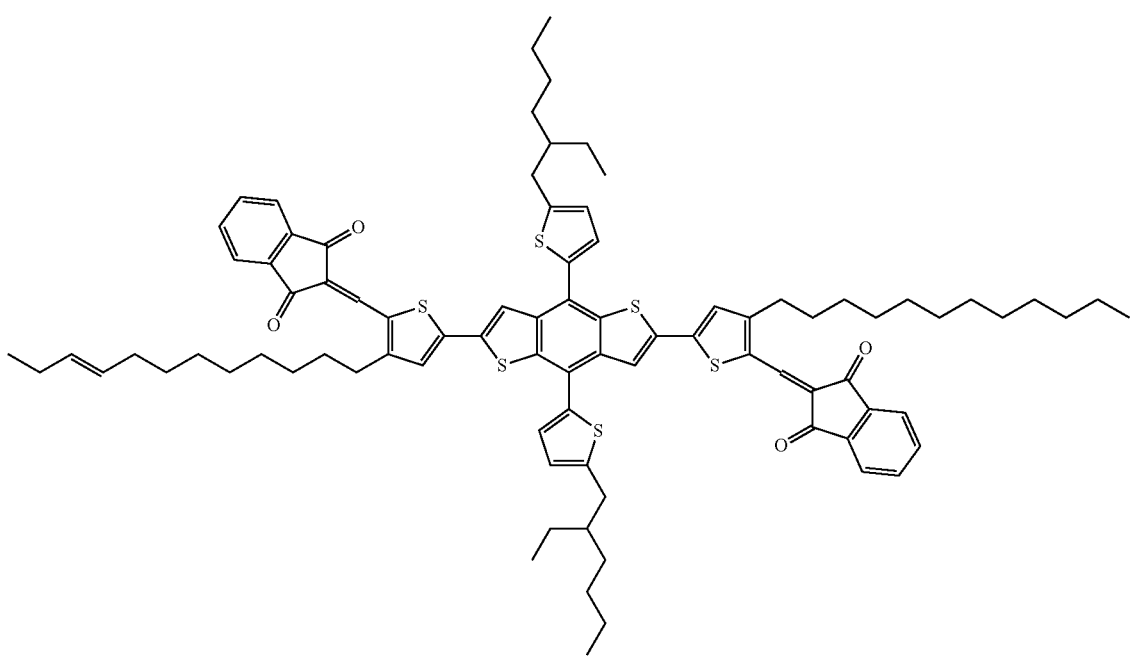

-continued
Example Compound 5
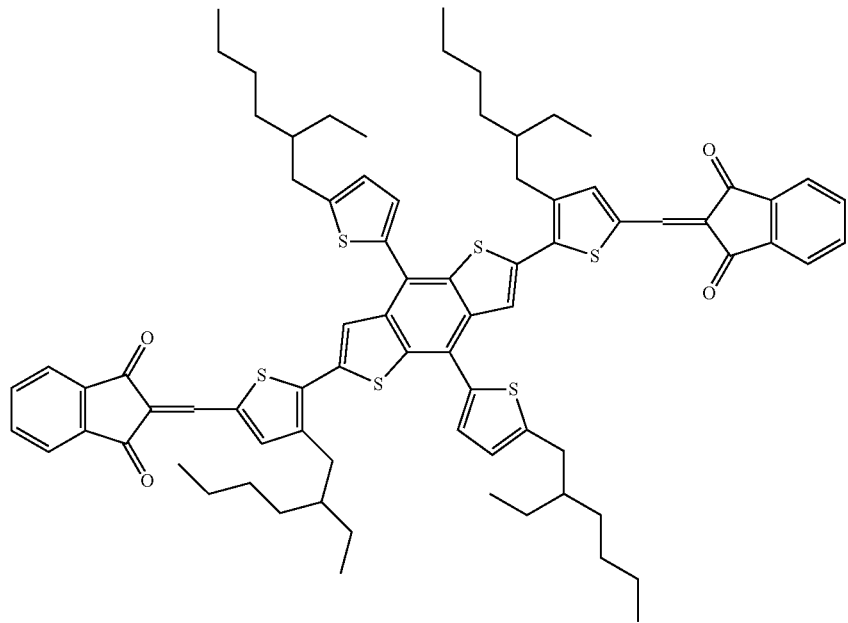
Example Compound 6
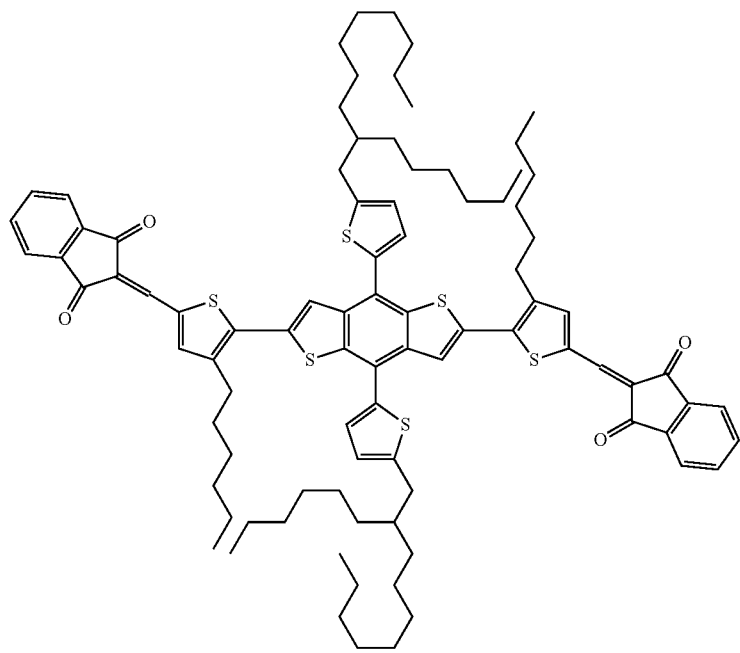

-continued
Example Compound 7
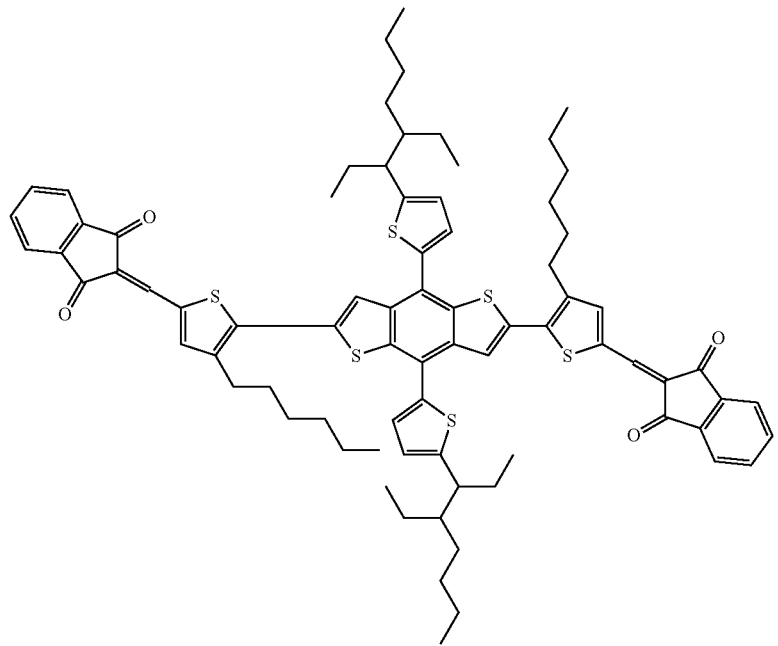
Example Compound 8
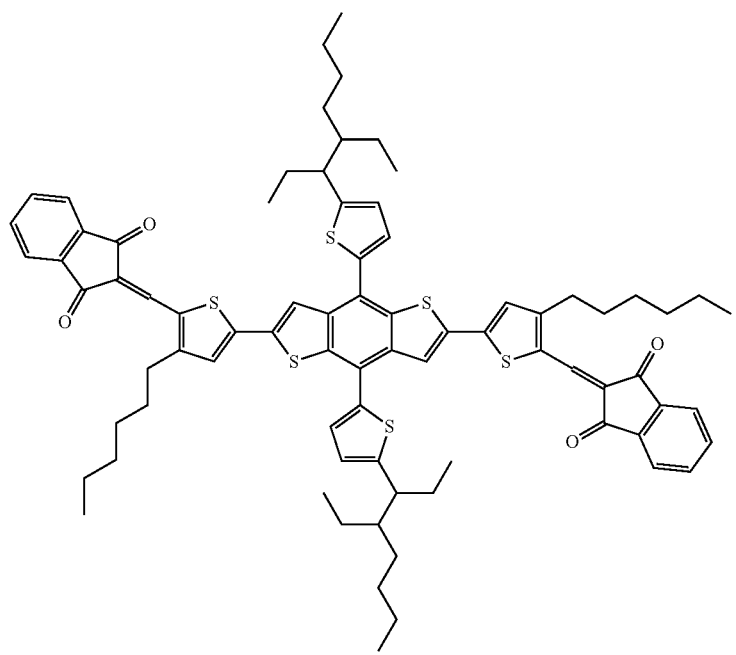

Example Compound 9
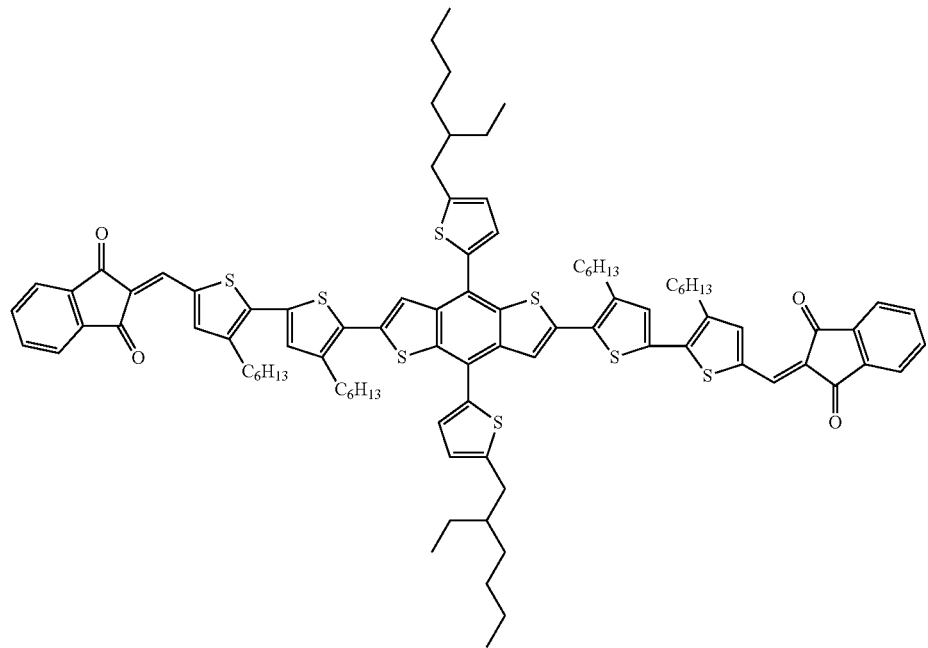
Example Compound 10
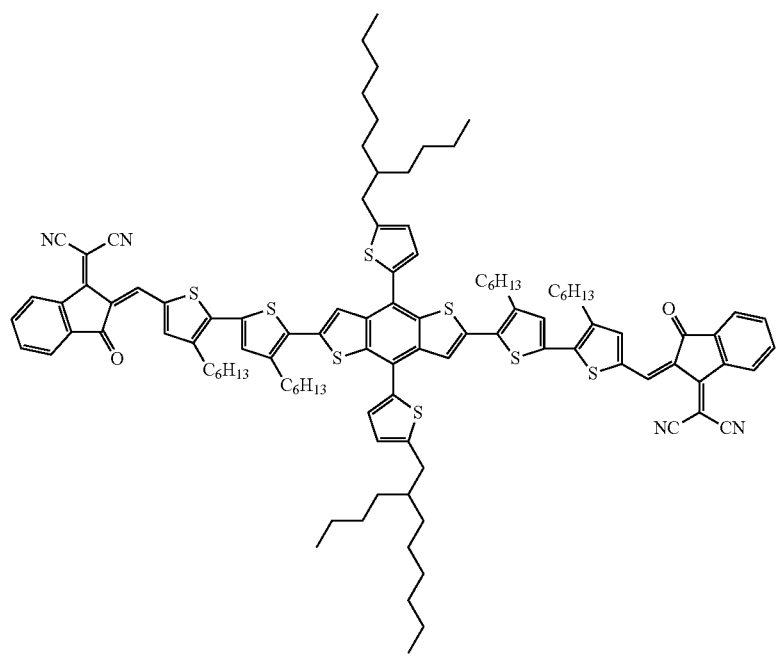

-continued
Example Compound 11
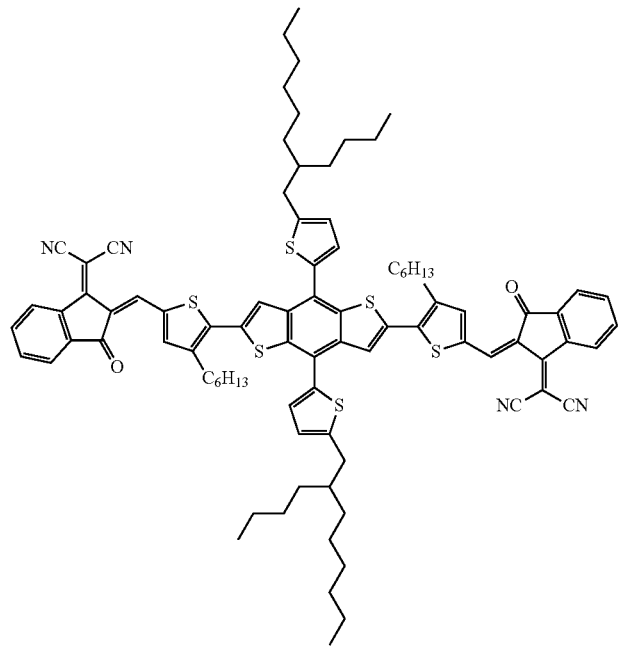
Example Compound 12
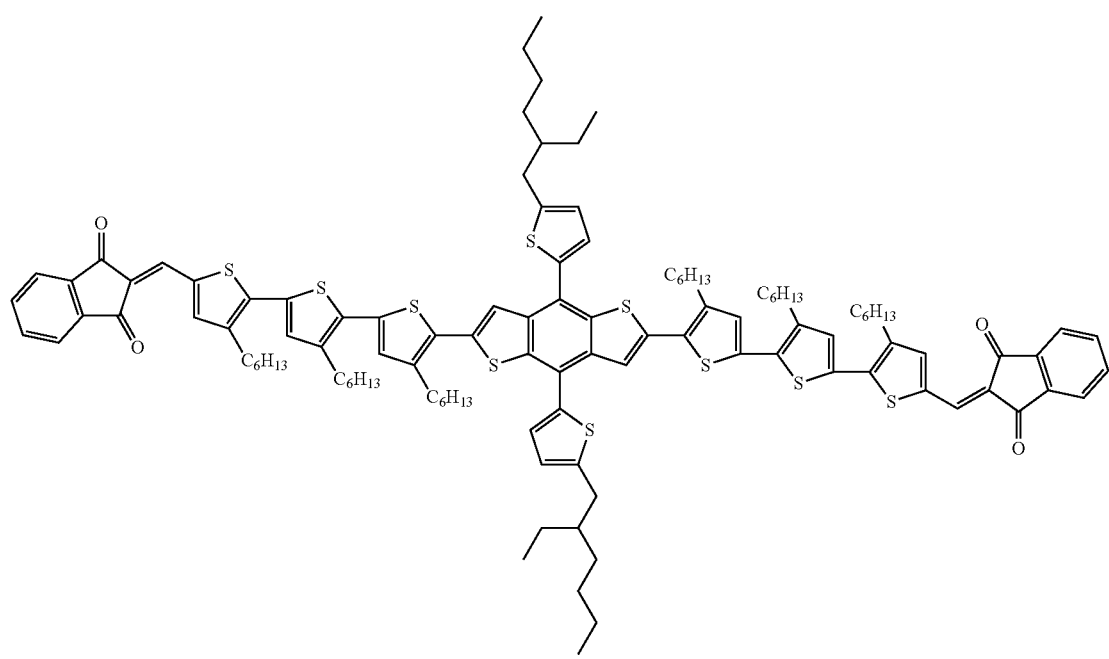

-continued

Example Compound 13

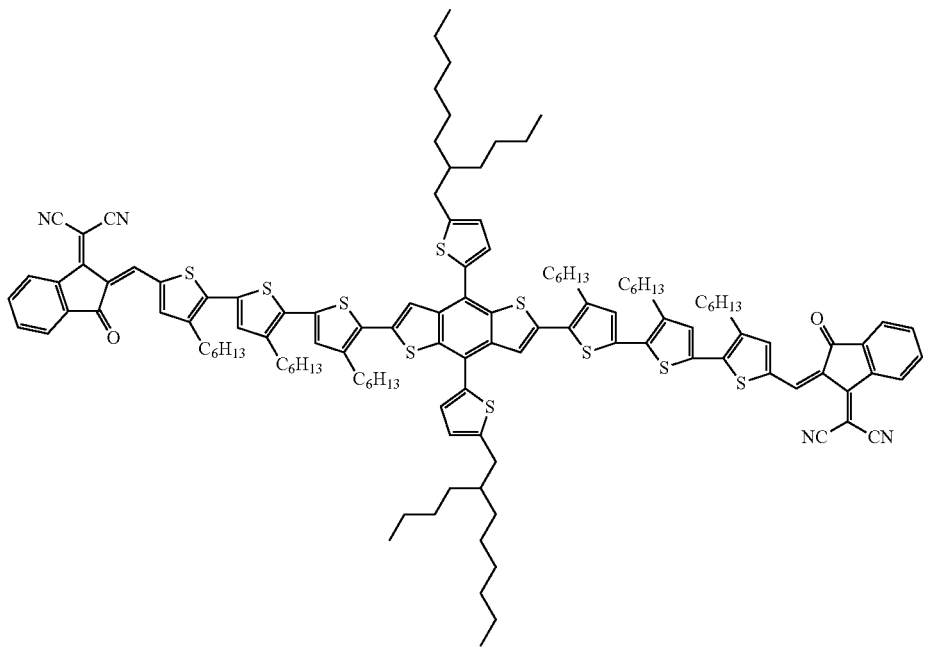

Example Compound 14

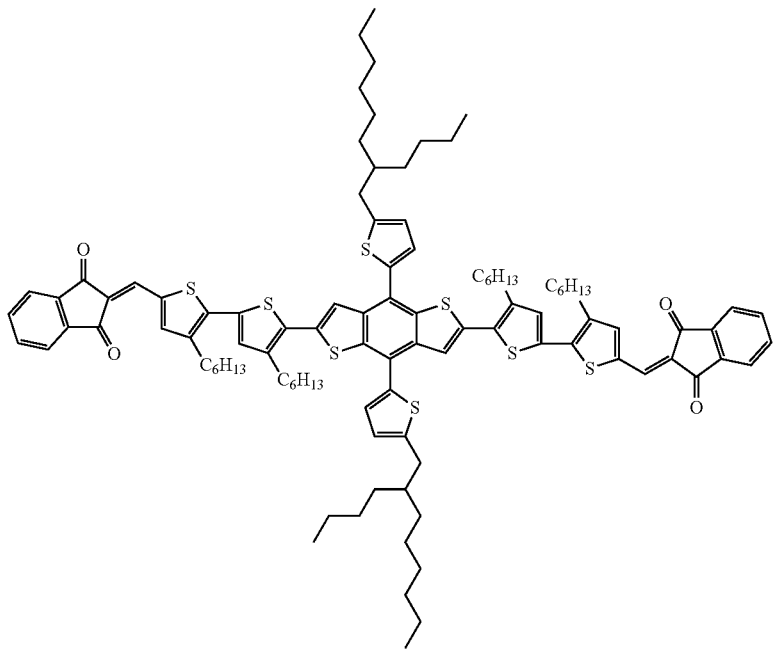

Second Material

The second material is a fullerene derivative represented by the formula (2). It is easy to form a thin film of this fullerene derivative by means of coating, since it is highly soluble in various organic solvents. In addition, this fullerene derivative expresses high photoelectric conversion efficiency when used as an n-type semiconductor material for an optical conversion layer having a bulk heterojunction structure. This fullerene derivative expresses excellent performance as an n-type semiconductor material used for organic thin film solar cells.

In the formula (2), Ar represents an aryl group such as phenyl group, naphthyl group, anthryl group, and phenanthryl group. Preferably, Ar is phenyl group.

The aryl group represented by Ar may have a substituent such as an aryl group, an alkyl group, a cyano group, and an alkoxy group. Specific examples of the aryl group as the substituent include phenyl group. The alkyl group and the alkyl-group part of the alkoxy group, as the substituents, may be each an alkyl group having 1 to 20 carbon atoms, which is equivalent to the alkyl group as $Y_1$ and $Y_2$ in the formula (2), to be described later. The number and substituted positions of the substituents are not limited to any particular condition. As an example, Ar may be substituted with about 1 to 3 substituents at any positions.

Each of $Y_1$ and $Y_2$ may independently represent an alkyl group. Preferably, the alkyl group has about 1 to 20 carbon atoms, more preferably about 1 to 12 carbon atoms, and most preferably about 6 to 12 carbon atoms. The alkyl group may be either a straight-chain alkyl group or a branched-chain alkyl group. The alkyl group may contain a heteroelement, such as S and O, in the carbon chain thereof.

Each of $Y_1$ and $Y_2$ may independently represent an alkenyl group. Preferably, the alkenyl group has about 2 to 10 carbon atoms. Specific preferred examples of the alkenyl group include, but are not limited to, straight-chain or branched-chain alkenyl groups having 2 to 4 carbon atoms, such as vinyl group, 1-propenyl group, allyl group, isopropenyl group, 1-butenyl group, 2-butenyl group, 3-butenyl group, 1-methyl-2-propenyl group, and 1,3-butadienyl group.

Each of $Y_1$ and $Y_2$ may independently represent an alkynyl group. Preferably, the alkynyl group has about 1 to 10 carbon atoms. Specific preferred examples of the alkynyl group include, but are not limited to, straight-chain or branched-chain alkynyl groups having 2 to 4 carbon atoms, such as ethynyl group, 1-propynyl group, 2-propynyl group, 1-methyl-2-propynyl group, 1-butynyl group, 2-butynyl group, and 3-butynyl group.

Each of $Y_1$ and $Y_2$ may independently represent an aryl group, such as phenyl group, naphthyl group, anthryl group, and phenanthryl group.

Each of $Y_1$ and $Y_2$ may independently represent an aralkyl group having about 7 to 20 carbon atoms, such as 2-phenylethyl group, benzyl group, 1-phenylethyl group, 3-phenylpropyl group, and 4-phenylbutyl group.

Each of $Y_1$ and $Y_2$ may have a substituent. Specific examples of the substituent include, but are not limited to, an alkyl group, an alkoxycarbonyl group, a polyether group, an alkanoyl group, an amino group, an aminocarbonyl group, an alkoxy group, an alkylthio group, and a group represented by the formula —CONHCOR' (where R' represents an alkyl group), —C(=NR')—R" (where each of R' and R" independently represents an alkyl group), or —NR'=CR"R'" (where each of R', R", and R'" independently represents an alkyl group).

Specific examples of the polyether group include, but are not limited to, a group represented by the formula $Y_3$—$(OY_4)_n$—O—, where $Y_3$ represents a monovalent hydrocarbon group such as an alkyl group, and $Y_4$ represents a divalent aliphatic hydrocarbon group. Specifically, the unit —$(OY_4)_n$— may be an alkoxy chain represented by the formula —$(OCH_2)_n$—, —$(OC_2H_4)_n$—, or —$(OC_3H_6)_n$—. Preferably, the number of repetition (n) of the repeating unit is about 1 to 20, more preferably about 1 to 5. The unit —$(OY_4)_n$— may include either a single type or two or more types of repeating units. The repeating unit represented by —$OC_2H_4$— or —$OC_3H_6$— may be either a straight-chain unit or a branched-chain unit.

Among the above substituents, preferably, the alkyl group and those having an alkyl-group part, i.e., the alkoxycarbonyl group, alkanoyl group, alkoxy group, alkylthio group, polyether group, and group represented by the formula —CONHCOR', —C(=NR')—R", or —NR'=CR"R'", have about 1 to 20 carbon atoms, more preferably about 1 to 12 carbon atoms, and most preferably about 6 to 12 carbon atoms in each alkyl-group part.

Preferably, the amino group and the amino-group part of the aminocarbonyl group each may be an amino group to which one or two alkyl groups each having about 1 to 20 carbon atoms is/are bonded.

According to an embodiment of the present invention, the fullerene derivative provides high performance when Ar is a phenyl group that may have a substituent, one of $Y_1$ and $Y_2$ is a hydrogen atom, and the other one of $Y_1$ and $Y_2$ is selected from an alkyl group having an alkoxycarbonyl substituent, an alkyl group having an alkoxy substituent, an alkyl group having a polyether substituent, an alkyl group having an amino substituent, and a phenyl group that may have a substituent. Moreover, the fullerene derivative provides much higher performance when Ar is a phenyl group that may have a phenyl substituent, a cyano substituent, or an alkyl substituent, one of $Y_1$ and $Y_2$ is a hydrogen atom, and the other one of $Y_1$ and $Y_2$ is selected from an alkyl group having an alkoxycarbonyl substituent, an alkyl group having an alkoxy substituent, an alkyl group having a polyether substituent, a phenyl group, a phenyl group having an alkyl substituent, a phenyl group having an alkoxycarbonyl substituent, and a phenyl group having an alkoxy substituent.

In these cases, the fullerene derivative contains a specific group having a proper polarity on its pyrrolidine skeleton, therefore having excellent self-organization property. Thus, the fullerene derivative can form an optical conversion layer having a bulk heterojunction structure with an appropriate layer separation structure, that expresses high electron mobility and conversion efficiency. Most preferably, Ar is phenyl group, one of $Y_1$ and $Y_2$ is a hydrogen atom, and the other one of $Y_1$ and $Y_2$ is selected from an unsubstituted alkyl group having 4 to 6 carbon atoms, an unsubstituted phenyl group, 1-naphthyl group, and 2-naphthyl group.

Substrate

Preferably, the substrate is made of a transparent material, such as glass, a transparent plastic plate, a transparent plastic film, and an inorganic transparent crystalline body, but is not limited thereto.

Conductive Film and Electrode

At least one of the conductive film and the electrode is visible-light-transmissive, but the other one may be either visible-light-transmissive or non-transmissive.

Visible-light-transmissive materials that have been used for typical photoelectric conversion elements and liquid crystal panels can be used for the conductive film and the electrode according to some embodiments of the present invention. Specific examples of usable visible-light-transmissive materials include, but are not limited to, conductive metal oxides, such as tin-doped indium oxide (ITO), fluorine-doped tin oxide (FTO), antimony-doped tin oxide (ATO), aluminum-doped zinc oxide (AZO), and gallium-doped zinc oxide (GZO).

Preferably, the conductive film or electrode that is visible-light-transmissive has an average thickness of from 5 nm to 10 μm, more preferably from 50 nm to 1 μm.

The visible-light-transmissive conductive film is preferably disposed on a substrate made of a visible-light-transmissive material, for maintaining a certain degree of hardness. Such a substrate may be integrated with an electrode. Specific examples of combined structures of the visible-light-transmissive conductive film with the substrate include, but are not limited to, FTO-coated glass, ITO-coated glass, zinc-oxide-and-aluminum-coated glass, FTO-coated transparent plastic films, and ITO-coated transparent plastic films.

Specific examples of the visible-light-transmissive conductive film include, but are not limited to, a combined structure of a glass substrate and a metal film having a light-transmissive structure, such as mesh-like and strip-like structures, disposed on the glass substrate; and a laminated structure of a carbon nanotube or graphene, that expresses transparency. The visible-light-transmissive conductive film may be formed of either a single material or two or more materials mixed with or laminated on each other.

For the purpose of reducing the resistance of the substrate, metallic lead wires may be used. Specific examples of materials used for the metallic lead wire include, but are not limited to, aluminum, copper, silver, gold, platinum, and nickel. The metallic lead wire may be disposed to the substrate by means of vapor deposition, sputtering, or pressure bonding, and ITO or FTO may be further provided thereon.

In a case in which one of an electron collecting electrode and a hole collecting electrode is an opaque electrode, metals (e.g., platinum, gold, silver, copper, aluminum) and graphite may be used therefor. The opaque electrode is not limited in thickness, and may be formed of either a single material or two or more materials laminated on each other.

Hole Transport Layer

The hole transport layer is provided for improving a hole collecting efficiency. The hole transport layer may be formed of a conductive polymer (e.g., PEDOT:PSS (polyethylene dioxythiophene:polystyrene sulfonic acid)), a hole-transporting organic compound (e.g., aromatic amine derivatives), or a hole-transporting inorganic compound (e.g., molybdenum oxide, vanadium oxide, nickel oxide), by means of spin coating, sol-gel process, or sputtering. Preferably, the hole transport layer is formed of molybdenum oxide.

Preferably, the hole transport layer has an average thickness of from 1 to 50 nm, so as to cover the entire surface of the underlying layer with a thin film.

Electron Transport Layer

The electron transport layer may be formed an electron-accepting organic material (e.g., perylenetetracarboxylic anhydride, perylenetetracarboxylic diimide, oxazole derivatives, triazole derivatives, phenanthroline derivatives, phosphine oxide derivatives, fullerene compounds, CNT, CN-PV), an inorganic material (e.g., zinc oxide, titanium oxide, tin oxide, lithium fluoride, calcium metal), or an amino polymer (e.g., polyethylenimine, terminal-ethoxylated polyethylenimine, poly[(9,9-bis(3'-(N,N-dimethylamino)propyl)-2,7-fluorene)-ortho-2,7-(9,9-dioctylfluorene)], poly[(9,9-bis(3'-((N,N-dimethyl)-N-ethylammonium)propyl)-2,7-fluorene)-ortho-2,7-(9,9-dioctylfluorene)]). For the purpose of adsorbing a basic carboxylic acid derivative, metal oxides such as zinc oxide, titanium oxide, and tin oxide, and amino polymers such as polyethylenimine are preferable.

The electron transport layer may have a laminated structure. A layer containing a low-molecular-weight amine compound may be laminated on the electron transport layer. Specific examples of the low-molecular-weight amine compound include, but are not limited to, compounds represented by the following formula (4).

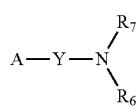

Formula (4)

In the formula (4), each of $R_6$ and $R_7$ independently represents an alkyl group having 1 to 4 carbon atoms or benzyl group. Specific examples of the alkyl group include, but are not limited to, methyl group and ethyl group. Preferably, the alkyl group is methyl group. $R_6$ and $R_7$ may share bond connectivity to form a ring. Y represents a divalent aromatic group having 6 to 14 carbon atoms or an alkylene group having 1 to 4 carbon atoms, such as a divalent benzene group, a divalent naphthalene group, and a divalent anthracene group. Preferably, Y is a benzene group. In the formula (4), A represents any of the below-listed substituents. Preferably, A is —COOH.

—COOH

—P(=O)(OH)$_2$

—Si(OH)$_3$

The electron transport layer may be formed by means of spin coating, sol-gel process, or sputtering.

Preferably, the electron transport layer has an average thickness of from 10 to 100 nm, so as to cover the entire surface of the underlying layer with a thin film.

Other Materials

The photoelectric conversion element according to some embodiments of the present invention may further include other layers, such as a gas barrier layer, a protective layer, and a buffer layer.

The gas barrier layer may be formed of an inorganic material such as silicon nitride and silicon oxide.

The photoelectric conversion element according to some embodiments of the present invention may have a laminated structure in which two or more photoelectric conversion layers are tandemly bonded via at least one intermediate electrode.

For example, the photoelectric conversion element may have a laminated structure in which, from the innermost side thereof, a substrate, a lower electrode, a hole transport layer, a first photoelectric conversion layer, an intermediate electrode, a second photoelectric conversion layer, an electron transport layer, and an upper electrode are laminated. Such a laminated structure improves open voltage.

In the above-described laminated structure, it is preferable that at least one of the multiple photoelectric conversion layers includes the organic material represented by the formula (1) and the other layers include an organic material having an absorption wavelength different from that of the organic material represented by the formula (1), so as not to reduce short-circuit current.

Specific examples of such an organic material include, but are not limited to, polymer materials (e.g., polyphenylene compounds, polyphenylene vinylene compounds, polyfluorene compounds, polyphenylene compounds) and low-molecular-weight materials (e.g., porphyrin, phthalocyanine).

Use Application

The photoelectric conversion element according to some embodiments of the present invention is applicable to power-supply devices when used in combination with a circuit board that controls a generated current. Specific examples of instruments using such a power-supply device include, but are not limited to, electronic desk calculators and watches. In addition, such a power-supply device using the photoelectric conversion element according to some embodiments of the present invention is applicable to cell phones, electronic organizers, and electronic papers. In addition, such a power-supply device using the photoelectric conversion element according to some embodiments of the present invention can also be used as an auxiliary power supply for lengthening the continuous operating time of charging-type or battery-type electronic devices. Furthermore, such a power-supply device using the photoelectric conversion element according to some embodiments of the present invention is applicable to image sensors.

EXAMPLES

Having generally described this invention, further understanding can be obtained by reference to certain specific examples which are provided herein for the purpose of illustration only and are not intended to be limiting.

Example 1

Preparation of Electron Transport Layer

First, 1 g of zinc acetate (available from Sigma-Aldrich), 0.28 g of ethanolamine (available from Sigma-Aldrich), and 10 mL of methoxyethanol (available from Wako Pure Chemical Industries, Ltd.) were subjected to a stirring all night at room temperature, thus preparing a zinc oxide precursor solution. Next, the zinc oxide precursor solution was applied onto an ITO substrate by spin coating to form a coating film having a thickness of 20 nm. The coating film was dried at 200° C. for 10 minutes. Thus, an electron transport layer containing zinc oxide was prepared.

Preparation of Photoelectric Conversion Layer

First, 35 parts by weight of the Example Compound 1 and 65 parts by weight of a compound represented by the following formula (A) were mixed. (The mixing ratio was 35:65.) The mixture was dissolved in 0.4 mL of chloroform containing 1% by volume of 1-chloronaphthalene (available from Tokyo Chemical Industry Co., Ltd.). Thus, a photoelectric conversion solution was prepared. The photoelectric conversion solution had a solid content concentration of 20 mg/mL. Next, the photoelectric conversion solution was applied onto the electron transport layer by spin coating at 100 rpm (revolutions per minute). Thus, a photoelectric conversion layer was prepared.

Formula (A)

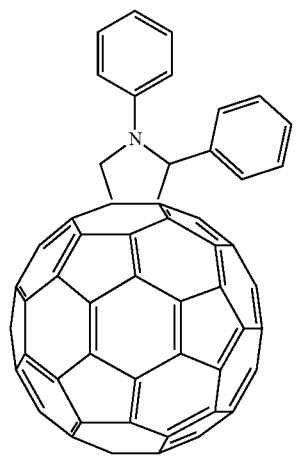

Preparation of Hole Transport Layer and Electrode

On the photoelectric conversion layer, a hole transport layer having a thickness of 10 nm was formed with molybdenum oxide (available from Kojundo Chemical Laboratory Co., Ltd.), and an electrode having a thickness of 100 nm was further formed thereon with silver, each by vacuum deposition technique. Thus, a photoelectric conversion element (solar cell) was prepared.

(1) Evaluation of Maximum Output Retention Rate after Storage Test at 70° C. for 100 Hours The above-prepared solar cell was subjected to a measurement of maximum output under a white LED illumination (0.01 mW/cm$^2$). The solar cell was then stored in a thermostatic chamber having a temperature of 70° for 100 hours. After being taken out from the thermostatic chamber, the solar cell was allowed to stand at rest at room temperature for 2 hours, and thereafter subjected to the measurement of maximum output again in the same manner as above.

The maximum output retention rate was calculated by the following formula. The result is shown in Table 1-1.

Maximum Output Retention Rate (%)=(Maximum Output After Storage Test)/(Maximum Output Before Storage Test)×100

The used white LED was a desk lamp CDS-90a (in Study Mode) available from Cosmotechno Co., Ltd. The output was measured with a solar cell evaluating system As-510-PV 03 available from NF Corporation.

(2) Evaluation of Maximum Output Retention Rate after Storage Test at 85° C. for 100 Hours The solar cell was stored in a thermostatic chamber having a temperature of 85° C. filled with nitrogen atmosphere for 100 hours, and thereafter subjected to the measurement of maximum output and calculation of the maximum output retention rate in the same manner as above.

(3) Evaluation of Maximum Output Retention Rate after Continuous Irradiation with Pseudo Sunlight for 10 Hours The solar cell was irradiated with pseudo sunlight emitted from a solar simulator (AM1.5, 100 mW/cm$^2$) for 10 hours in a continuous manner in nitrogen atmosphere. The solar cell was thereafter subjected to the measurement of maximum output and calculation of the maximum output retention rate in the same manner as above.

Examples 2 to 10

The procedure in Example 1 was repeated except for changing the mixing ratio between the Example Compound 1 and the compound represented by the formula (A) as listed below.

|  | Mixing Ratio |
|---|---|
| Example 1 | 35:65 |
| Example 2 | 40:60 |
| Example 3 | 45:55 |
| Example 4 | 50:50 |
| Example 5 | 55:45 |
| Example 6 | 60:40 |
| Example 7 | 65:35 |
| Example 8 | 70:30 |
| Example 9 | 75:25 |
| Example 10 | 80:20 |

Thus, solar cells of Examples 2 to 10 were prepared and evaluated.

The evaluation results are shown in Table 1-1.

Example 11

The procedure in Example 5 was repeated except for replacing the Example Compound 1 with the Example Compound 10. Thus, a solar cell of Example 11 was prepared and evaluated. The evaluation results are shown in Table 1-1.

Example 12

The procedure in Example 4 was repeated except for replacing the Example Compound 1 with the Example Compound 2. Thus, a solar cell of Example 12 was prepared and evaluated. The evaluation results are shown in Table 1-1.

Example 13

The procedure in Example 4 was repeated except for replacing the Example Compound 1 with the Example Compound 13. Thus, a solar cell of Example 13 was prepared and evaluated. The evaluation results are shown in Table 1-1.

Example 14

The procedure in Example 4 was repeated except for replacing the compound represented by the formula (A) with another compound represented by the following formula (B). Thus, a solar cell of Example 14 was prepared and evaluated. The evaluation results are shown in Table 1-1.

Formula (B)

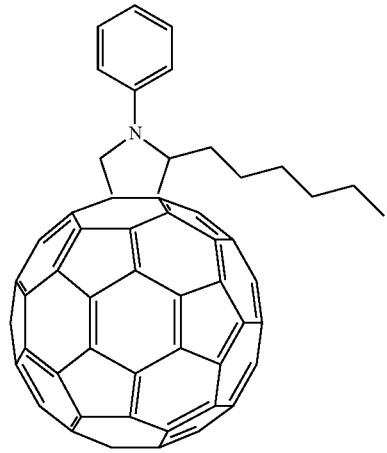

Example 15

The procedure in Example 4 was repeated except for replacing the Example Compound 1 with the Example Compound 2. Thus, a solar cell of Example 15 was prepared and evaluated. The evaluation results are shown in Table 1-1.

Example 16

The procedure in Example 4 was repeated except for replacing the Example Compound 1 with the Example Compound 10. Thus, a solar cell of Example 16 was prepared and evaluated. The evaluation results are shown in Table 1-1.

Example 17

The procedure in Example 4 was repeated except for replacing the electron transport layer with another electron transport layer prepared in the following manner. Thus, a solar cell of Example 17 was prepared and evaluated. The evaluation results are shown in Table 1-1.
Preparation of Electron Transport Layer
An electron transport layer containing titanium oxide was formed on an ITO glass substrate by reactive sputtering with oxygen gas using a titanium metal target, using a sputtering device Unaxis DVD-Sprinter available from OC Oerlikon Holdings AG. The electron transport layer had a thickness of 10 nm.

Example 18

The procedure in Example 5 was repeated except for replacing the Example Compound 1 with the Example Compound 9. Thus, a solar cell of Example 18 was prepared and evaluated. The evaluation results are shown in Table 1-1.

Example 19

The procedure in Example 5 was repeated except for replacing the Example Compound 1 with the Example Compound 12. Thus, a solar cell of Example 19 was prepared and evaluated. The evaluation results are shown in Table 1-1.

Example 20

The procedure in Example 4 was repeated except for replacing the electron transport layer with another electron transport layer prepared in the following manner. Thus, a solar cell of Example 20 was prepared and evaluated. The evaluation results are shown in Table 1-1.
Preparation of Electron Transport Layer
An 80% ethoxylated polyethylenimine solution (available from Sigma-Aldrich) was diluted with ethanolamine (available from Sigma-Aldrich) to prepare a coating liquid having a polyethylenimine concentration of 0.2% by weight. Next, the coating liquid was applied onto an ITO substrate by spin coating to form a coating film having a thickness of 3 nm. The coating film was dried at 100° C. for 10 minutes. Thus, an electron transport layer was prepared.

Example 21

The procedure in Example 20 was repeated except for replacing the Example Compound 1 with the Example Compound 9. Thus, a solar cell of Example 21 was prepared and evaluated. The evaluation results are shown in Table 1-1.

Example 22

The procedure in Example 20 was repeated except for replacing the Example Compound 1 with the Example Compound 12. Thus, a solar cell of Example 22 was prepared and evaluated. The evaluation results are shown in Table 1-1.

Example 23

The procedure in Example 20 was repeated except for replacing the 80% ethoxylated polyethylenimine solution (available from Sigma-Aldrich) with poly[(9,9-bis(3'-((N,N-dimethyl)-N-ethylammonium)propyl)-2,7-fluorene)-ortho-2,7-(9,9-dioctylfluorene)]) (available from Luminescence Technology Corp. (Lumtec)). Thus, a solar cell of Example 23 was prepared and evaluated. The evaluation results are shown in Table 1-1.

Example 24

The procedure in Example 23 was repeated except for replacing the Example Compound 1 with the Example Compound 9. Thus, a solar cell of Example 24 was prepared and evaluated. The evaluation results are shown in Table 1-1.

Example 25

The procedure in Example 23 was repeated except for replacing the Example Compound 1 with the Example Compound 12. Thus, a solar cell of Example 25 was prepared and evaluated. The evaluation results are shown in Table 1-1.

Example 26

The procedure in Example 4 was repeated except for replacing the electron transport layer with another electron transport layer prepared in the following manner. Thus, a solar cell of Example 26 was prepared and evaluated. The evaluation results are shown in Table 1-1.
Preparation of Electron Transport Layer First, 1 g of zinc acetate (available from Sigma-Aldrich), 0.28 g of ethanolamine (available from Sigma-Aldrich), and 10 mL of methoxyethanol (available from Wako Pure Chemical Industries, Ltd.) were subjected to a stirring all night at room temperature, thus preparing a zinc oxide precursor solution. Next, the zinc oxide precursor solution was applied onto an ITO substrate by spin coating to form a first coating film having a thickness of 20 nm. The first coating film was dried at 200° C. for 10 minutes. Thus, a zinc oxide layer was prepared.

Further, an 80% ethoxylated polyethylenimine solution (available from Sigma-Aldrich) was diluted with ethanolamine (available from Sigma-Aldrich) to prepare a coating liquid having a polyethylenimine concentration of 0.2% by weight. The coating liquid was applied onto the zinc oxide layer by spin coating to form a second coating film having a thickness of 3 nm. The second coating film was dried at 100° C. for 10 minutes. Thus, an electron transport layer was prepared in which the zinc oxide layer and the polyethylenimine layer were laminated.

Example 27

The procedure in Example 26 was repeated except for replacing the Example Compound 1 with the Example Compound 9. Thus, a solar cell of Example 27 was prepared and evaluated. The evaluation results are shown in Table 1-1.

Example 28

The procedure in Example 26 was repeated except for replacing the Example Compound 1 with the Example Compound 12. Thus, a solar cell of Example 28 was prepared and evaluated. The evaluation results are shown in Table 1-1.

Example 29

The procedure in Example 4 was repeated except for replacing the electron transport layer with another electron transport layer prepared in the following manner. Thus, a solar cell of Example 29 was prepared and evaluated. The evaluation results are shown in Table 1-1.
Preparation of Electron Transport Layer An 80% ethoxylated polyethylenimine solution (available from Sigma-Aldrich) was diluted with ethanolamine (available from Sigma-Aldrich) to prepare a coating liquid having a polyethylenimine concentration of 0.2% by weight. Next, the coating liquid was applied onto an ITO substrate by spin coating to form a first coating film having a thickness of 3 nm. The first coating film was dried at 100° C. for 10 minutes. Thus, a polyethylenimine layer was prepared.

Further, 1 g of zinc acetate (available from Sigma-Aldrich), 0.28 g of ethanolamine (available from Sigma-Aldrich), and 10 mL of methoxyethanol (available from Wako Pure Chemical Industries, Ltd.) were subjected to a stirring all night at room temperature, thus preparing a zinc oxide precursor solution. The zinc oxide precursor solution was applied onto the polyethylenimine layer by spin coating to form a second coating film having a thickness of 20 nm. The second coating film was dried at 200° C. for 10 minutes. Thus, an electron transport layer was prepared in which the polyethylenimine layer and the zinc oxide layer were laminated.

Example 30

The procedure in Example 29 was repeated except for replacing the Example Compound 1 with the Example Compound 9. Thus, a solar cell of Example 30 was prepared and evaluated. The evaluation results are shown in Table 1-1.

Example 31

The procedure in Example 29 was repeated except for replacing the Example Compound 1 with the Example Compound 12. Thus, a solar cell of Example 31 was prepared and evaluated. The evaluation results are shown in Table 1-1.

Example 32

The procedure in Example 4 was repeated except for replacing the electron transport layer with another electron transport layer prepared in the following manner. Thus, a solar cell of Example 32 was prepared and evaluated. The evaluation results are shown in Table 1-1.
Preparation of Electron Transport Layer First, 1 g of zinc acetate (available from Sigma-Aldrich), 0.28 g of ethanolamine (available from Sigma-Aldrich), and 10 mL of methoxyethanol (available from Wako Pure Chemical Industries, Ltd.) were subjected to a stirring all night at room temperature, thus preparing a zinc oxide precursor solution. Next, the zinc oxide precursor solution was applied onto an ITO substrate by spin coating to form a coating film having a thickness of 20 nm. The coating film was dried at 200° C. for 10 minutes. Thus, a zinc oxide layer was prepared.

Further, dimethylaminobenzoic acid (available from Tokyo Chemical Industry Co., Ltd.) was diluted with ethanol to prepare a coating liquid having a concentration of 1 mg/mL. The coating liquid was applied onto the zinc oxide layer by spin coating. Thus, an electron transport layer was prepared in which the zinc oxide layer and the dimethylaminobenzoic acid layer were laminated.

Example 33

The procedure in Example 32 was repeated except for replacing the Example Compound 1 with the Example Compound 9. Thus, a solar cell of Example 33 was prepared and evaluated. The evaluation results are shown in Table 1-1.

Example 34

The procedure in Example 32 was repeated except for replacing the Example Compound 1 with the Example Compound 12. Thus, a solar cell of Example 34 was prepared and evaluated. The evaluation results are shown in Table 1-1.

Example 35

The procedure in Example 4 was repeated except for replacing the electron transport layer with another electron transport layer prepared in the following manner. Thus, a solar cell of Example 35 was prepared and evaluated. The evaluation results are shown in Table 1-1.
Preparation of Electron Transport Layer An 80% ethoxylated polyethylenimine solution (available from Sigma-Aldrich) was diluted with ethanolamine (available from Sigma-Aldrich) to prepare a first coating liquid having a polyethylenimine concentration of 0.2% by weight. Next, the first coating liquid was applied onto an ITO substrate by spin coating to form a first coating film having a thickness of 3 nm. The first coating film was dried at 100° C. for 10 minutes. Thus, a polyethylenimine layer was prepared.

Further, dimethylaminobenzoic acid (available from Tokyo Chemical Industry Co., Ltd.) was diluted with ethanol to prepare a second coating liquid having a concentration of 1 mg/mL. The second coating liquid was applied onto the polyethylenimine layer by spin coating. Thus, an electron transport layer was prepared in which the polyethylenimine layer and the dimethylaminobenzoic acid layer were laminated.

Example 36

The procedure in Example 35 was repeated except for replacing the Example Compound 1 with the Example Compound 9. Thus, a solar cell of Example 36 was prepared and evaluated. The evaluation results are shown in Table 1-1.

Example 37

The procedure in Example 35 was repeated except for replacing the Example Compound 1 with the Example Compound 12. Thus, a solar cell of Example 37 was prepared and evaluated. The evaluation results are shown in Table 1-1.

Example 38

The procedure in Example 4 was repeated except for replacing the electron transport layer with another electron transport layer prepared in the following manner. Thus, a solar cell of Example 38 was prepared and evaluated. The evaluation results are shown in Table 1-1.
Preparation of Electron Transport Layer First, 1 g of zinc acetate (available from Sigma-Aldrich), 0.28 g of ethanolamine (available from Sigma-Aldrich), and 10 mL of methoxyethanol (available from Wako Pure Chemical Industries, Ltd.) were subjected to a stirring all night at room temperature, thus preparing a zinc oxide precursor solution. Next, the zinc oxide precursor solution was applied onto an ITO substrate by spin coating to form a first coating film having a thickness of 20 nm. The first coating film was dried at 200° C. for 10 minutes. Thus, a zinc oxide layer was prepared.

An 80% ethoxylated polyethylenimine solution (available from Sigma-Aldrich) was diluted with ethanolamine (available from Sigma-Aldrich) to prepare a second coating liquid having a polyethylenimine concentration of 0.2% by weight. Next, the second coating liquid was applied onto the zinc oxide layer by spin coating to form a second coating film having a thickness of 3 nm. The second coating film was dried at 100° C. for 10 minutes. Thus, a polyethylenimine layer was prepared.

Further, dimethylaminobenzoic acid (available from Tokyo Chemical Industry Co., Ltd.) was diluted with ethanol to prepare a third coating liquid having a concentration of 1 mg/mL. The third coating liquid was applied onto a laminated layer of the zinc oxide layer and the polyethylenimine layer by spin coating. Thus, an electron transport layer was prepared in which the zinc oxide layer, the polyethylenimine layer, and the dimethylaminobenzoic acid layer were laminated.

Example 39

The procedure in Example 38 was repeated except for replacing the Example Compound 1 with the Example Compound 9. Thus, a solar cell of Example 39 was prepared and evaluated. The evaluation results are shown in Table 1-1.

Example 40

The procedure in Example 38 was repeated except for replacing the Example Compound 1 with the Example Compound 12. Thus, a solar cell of Example 40 was prepared and evaluated. The evaluation results are shown in Table 1-1.

Example 41

The procedure in Example 4 was repeated except for replacing the electron transport layer with another electron transport layer prepared in the following manner. Thus, a solar cell of Example 41 was prepared and evaluated. The evaluation results are shown in Table 1-1.
Preparation of Electron Transport Layer An 80% ethoxylated polyethylenimine solution (available from Sigma-Aldrich) was diluted with ethanolamine (available from Sigma-Aldrich) to prepare a first coating liquid having a polyethylenimine concentration of 0.2% by weight. Next, the first coating liquid was applied onto an ITO substrate by spin coating to form a first coating film having a thickness of 3 nm. The first coating film was dried at 100° C. for 10 minutes. Thus, a polyethylenimine layer was prepared.

Further, 1 g of zinc acetate (available from Sigma-Aldrich), 0.28 g of ethanolamine (available from Sigma-Aldrich), and 10 mL of methoxyethanol (available from Wako Pure Chemical Industries, Ltd.) were subjected to a stirring all night at room temperature, thus preparing a zinc oxide precursor solution. The zinc oxide precursor solution was applied onto the polyethylenimine layer by spin coating to form a second coating film having a thickness of 20 nm. The second coating film was dried at 200° C. for 10 minutes.

Thus, a laminated layer was prepared in which the polyethylenimine layer and the zinc oxide layer were laminated.

Further, dimethylaminobenzoic acid (available from Tokyo Chemical Industry Co., Ltd.) was diluted with ethanol to prepare a third coating liquid having a concentration of 1 mg/mL. The third coating liquid was applied onto the laminated layer of the polyethylenimine layer and the zinc oxide layer by spin coating. Thus, an electron transport layer was prepared in which the polyethylenimine layer, the zinc oxide layer, and the dimethylaminobenzoic acid layer were laminated.

Example 42

The procedure in Example 41 was repeated except for replacing the Example Compound 1 with the Example Compound 9. Thus, a solar cell of Example 42 was prepared and evaluated. The evaluation results are shown in Table 1-1.

Example 43

The procedure in Example 41 was repeated except for replacing the Example Compound 1 with the Example Compound 12. Thus, a solar cell of Example 43 was prepared and evaluated. The evaluation results are shown in Table 1-1.

Comparative Example 1

The procedure in Example 5 was repeated except for replacing the Example Compound 1 with P3HT (poly(3-hexylthiophene), available from Merck). Thus, a solar cell of Comparative Example 1 was prepared and evaluated.

The evaluation results are shown in Table 1-2.

Comparative Example 2

The procedure in Example 5 was repeated except for replacing the Example Compound 1 with PTB7 (poly{4,8-bis[(2-ethylhexyl)oxy]benzo[1,2-b:4,5-b]dithiophene-2,6-diyl-ortho-3-fluoro-2-[(2-ethylhexyl)carbonyl]thieno[3,4-b]thiophene-4,6-diyl}, available from 1-Material-Organic Nano Electronic). Thus, a solar cell of Comparative Example 2 was prepared and evaluated. The evaluation results are shown in Table 1-2.

Comparative Example 3

The procedure in Example 5 was repeated except for replacing the Example Compound 1 with PCE-10 (poly{4,8-bis[5-(2-ethylhexyl)thiophene-2-yl]benzo[1,2-b:4,5-b']dithiophene-2,6-diyl-ortho-[4-(2-ethylhexyl)-3-fluorothieno[3,4-b]thiophene]-2-carboxylate-2-6-diyl}, available from 1-Material-Organic Nano Electronic). Thus, a solar cell of Comparative Example 3 was prepared and evaluated. The evaluation results are shown in Table 1-2.

Comparative Example 4

The procedure in Example 9 was repeated except for replacing the Example Compound 1 with P3HT (poly(3-hexylthiophene), available from Merck). Thus, a solar cell of Comparative Example 4 was prepared and evaluated. The evaluation results are shown in Table 1-2.

Comparative Example 5

The procedure in Example 5 was repeated except for replacing the compound represented by the formula (A) with PC61BM (phenyl-C61-methyl butyrate, available from Sigma-Aldrich). Thus, a solar cell of Comparative Example 5 was prepared and evaluated.

The evaluation results are shown in Table 1-2.

Comparative Example 6

The procedure in Example 5 was repeated except for replacing the compound represented by the formula (A) with PC71BM (phenyl-C71-methyl butyrate, available from Sigma-Aldrich). Thus, a solar cell of Comparative Example 6 was prepared and evaluated. The evaluation results are shown in Table 1-2.

Comparative Example 7

The procedure in Example 5 was repeated except for replacing the compound represented by the formula (A) with another compound represented by the following formula (C). Thus, a solar cell of Comparative Example 7 was prepared and evaluated. The evaluation results are shown in Table 1-2.

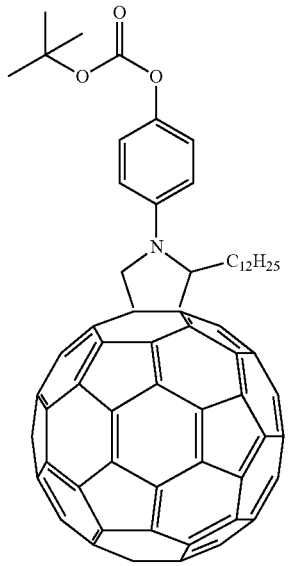

Formula (C)

Comparative Example 8

The procedure in Comparative Example 1 was repeated except for replacing the electron transport layer with another electron transport layer prepared in the following manner. Thus, a solar cell of Comparative Example 8 was prepared and evaluated. The evaluation results are shown in Table 1-2.

Preparation of Electron Transport Layer

An 80% ethoxylated polyethylenimine solution (available from Sigma-Aldrich) was diluted with ethanolamine (available from Sigma-Aldrich) to prepare a coating liquid having a polyethylenimine concentration of 0.2% by weight. Next, the coating was applied onto an ITO substrate by spin coating to form a coating film having a thickness of 3 nm. The coating film was dried at 100° C. for 10 minutes. Thus, an electron transport layer was prepared.

Comparative Example 9

The procedure in Comparative Example 8 was repeated except for replacing P3HT with PTB7. Thus, a solar cell of Comparative Example 9 was prepared and evaluated. The evaluation results are shown in Table 1-2.

Comparative Example 10

The procedure in Comparative Example 8 was repeated except for replacing P3HT with PCE-10. Thus, a solar cell of Comparative Example 10 was prepared and evaluated. The evaluation results are shown in Table 1-2.

Comparative Example 11

The procedure in Example 38 was repeated except for replacing the Example Compound 1 with P3HT. Thus, a solar cell of Comparative Example 11 was prepared and evaluated. The evaluation results are shown in Table 1-2.

Comparative Example 12

The procedure in Comparative Example 11 was repeated except for replacing P3HT with PTB7. Thus, a solar cell of Comparative Example 12 was prepared and evaluated. The evaluation results are shown in Table 1-2.

Comparative Example 13

The procedure in Comparative Example 11 was repeated except for replacing P3HT with PCE-10. Thus, a solar cell of Comparative Example 13 was prepared and evaluated. The evaluation results are shown in Table 1-2.

Comparative Example 14

The procedure in Example 41 was repeated except for replacing the Example Compound 1 with P3HT. Thus, a solar cell of Comparative Example 14 was prepared and evaluated. The evaluation results are shown in Table 1-2.

Comparative Example 15

The procedure in Comparative Example 14 was repeated except for replacing P3HT with PTB7. Thus, a solar cell of Comparative Example 15 was prepared and evaluated. The evaluation results are shown in Table 1-2.

Comparative Example 16

The procedure in Comparative Example 14 was repeated except for replacing P3HT with PCE-10. Thus, a solar cell of Comparative Example 16 was prepared and evaluated. The evaluation results are shown in Table 1-2.

TABLE 1-1

|  | Maximum Output Retention Rate after Storage Test at 70° C. for 100 Hours | Maximum Output Retention Rate after Storage Test at 85° C. for 100 Hours | Maximum Output Retention Rate after Continuous Irradiation with Pseudo Sunlight for 10 Hours |
| --- | --- | --- | --- |
| Example 1 | 69% | 45% | 42% |
| Example 2 | 79% | 51% | 45% |
| Example 3 | 81% | 50% | 51% |
| Example 4 | 90% | 51% | 43% |
| Example 5 | 90% | 43% | 49% |
| Example 6 | 89% | 40% | 45% |
| Example 7 | 86% | 52% | 52% |
| Example 8 | 82% | 50% | 54% |
| Example 9 | 79% | 58% | 48% |
| Example 10 | 68% | 45% | 49% |
| Example 11 | 85% | 43% | 41% |
| Example 12 | 89% | 58% | 45% |
| Example 13 | 88% | 45% | 54% |
| Example 14 | 86% | 51% | 51% |
| Example 15 | 85% | 48% | 45% |
| Example 16 | 87% | 49% | 48% |
| Example 17 | 85% | 51% | 41% |
| Example 18 | 85% | 69% | 65% |
| Example 19 | 82% | 61% | 63% |
| Example 20 | 89% | 64% | 61% |
| Example 21 | 81% | 63% | 67% |
| Example 22 | 90% | 67% | 62% |
| Example 23 | 91% | 61% | 67% |
| Example 24 | 86% | 68% | 65% |
| Example 25 | 88% | 69% | 66% |
| Example 26 | 81% | 73% | 78% |
| Example 27 | 88% | 71% | 74% |
| Example 28 | 83% | 69% | 75% |
| Example 29 | 83% | 78% | 79% |
| Example 30 | 81% | 79% | 78% |
| Example 31 | 85% | 71% | 71% |
| Example 32 | 90% | 85% | 74% |
| Example 33 | 87% | 78% | 75% |
| Example 34 | 88% | 80% | 78% |
| Example 35 | 86% | 76% | 80% |
| Example 36 | 84% | 73% | 75% |
| Example 37 | 91% | 74% | 78% |
| Example 38 | 87% | 88% | 82% |
| Example 39 | 90% | 89% | 83% |
| Example 40 | 89% | 85% | 85% |
| Example 41 | 87% | 87% | 84% |
| Example 42 | 91% | 84% | 89% |
| Example 43 | 83% | 87% | 87% |

TABLE 1-2

|  | Maximum Output Retention Rate after Storage Test at 70° C. for 100 Hours | Maximum Output Retention Rate after Storage Test at 85° C. for 100 Hours | Maximum Output Retention Rate after Continuous Irradiation with Pseudo Sunlight for 10 Hours |
| --- | --- | --- | --- |
| Comparative Example 1 | 30% | 21% | 45% |
| Comparative Example 2 | 28% | 24% | 33% |
| Comparative Example 3 | 33% | 31% | 36% |
| Comparative Example 4 | 31% | 25% | 31% |
| Comparative Example 5 | 35% | 28% | 29% |
| Comparative Example 6 | 39% | 29% | 31% |
| Comparative Example 7 | 40% | 33% | 33% |
| Comparative Example 8 | 31% | 29% | 39% |
| Comparative Example 9 | 38% | 26% | 34% |
| Comparative Example 10 | 29% | 27% | 40% |
| Comparative Example 11 | 37% | 29% | 31% |
| Comparative Example 12 | 40% | 33% | 28% |
| Comparative Example 13 | 45% | 34% | 38% |
| Comparative Example 14 | 39% | 38% | 34% |
| Comparative Example 15 | 41% | 31% | 36% |
| Comparative Example 16 | 46% | 34% | 39% |

It is clear from Tables 1-1 and 1-2 that the solar cells of Examples 1-43 exhibit extremely high maximum output retention rates even after being subjected to the storage test at high temperatures of 70° C. and 85° C. This means that the solar cells of Examples 1-43 are superior to those of Comparative Examples 1-16 in terms of heat resistance. In addition, the solar cells of Examples 1-43 exhibit extremely high maximum output retention rates even after being continuously irradiated with pseudo sunlight. This means that the solar cells of Examples 1-43 have excellent light resistance.

The photoelectric conversion elements according to some embodiments of the present invention provide superior heat resistance and light resistance by including the first material and the second material in the photoelectric conversion layer.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. A photoelectric conversion element comprising:

a conductive film;

an electron transport layer overlying the conductive film, the electron transport layer including at least one of titanium oxide and zinc oxide;

a photoelectric conversion layer overlying the electron transport layer, the photoelectric conversion layer including:

a first material represented by the following formula (1'):

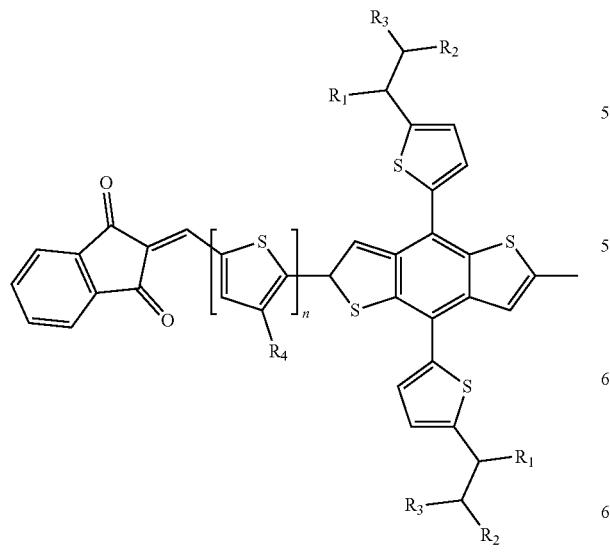

Formula (1')

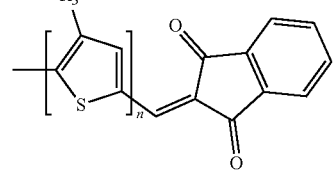

-continued wherein $R_1$ represents a hydrogen atom or a straight-chain or branched-chain alkyl group having 2 to 6 carbon atoms; each of $R_2$ and $R_3$ independently represents one of an ethyl group, a propyl group, a butyl group, a pentyl group, a hexyl group, an octyl group, and a decyl group; each of $R_4$ and $R_5$ independently represents a straight-chain or branched-chain alkyl group having 6 to 12 carbon atoms; and n represents an integer of 2 or 3; and a second material represented by the following formula (2);

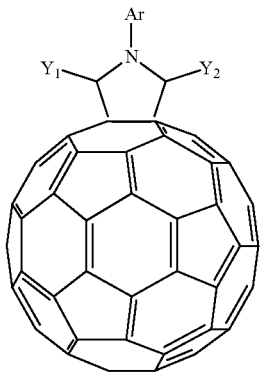

Formula (2)

wherein each of $Y_1$ and $Y_2$ independently represents a hydrogen atom, an alkyl group, an alkenyl group, an alkynyl group, an aryl group, or an aralkyl group, but each of $Y_1$ and $Y_2$ does not represent a hydrogen atom at the same time: Ar represents an aryl group; and a structural unit represented by the following formula (F) is a fullerene skeleton having 60 carbon atoms:

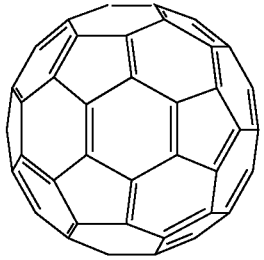

Formula (F)

a hole transport layer overlying the photoelectric conversion layer; and an electrode.

2. The photoelectric conversion element of claim 1, wherein the second material is represented by the following formula (3):

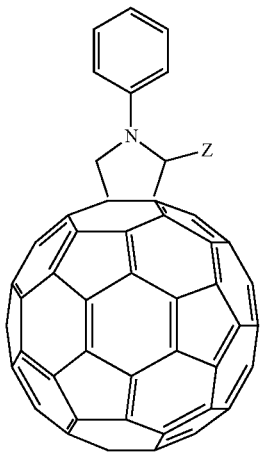

Formula (3)

wherein Z represents phenyl group, 1-naphthyl group, 2-naphthyl group, or n-hexyl group.

3. The photoelectric conversion element of claim 1, wherein a weight ratio of the first material to the second material is in the range of from 35/65 to 80/20.

4. The photoelectric conversion element of claim 1, wherein the electron transport layer includes a polymer compound having at least one of a secondary alkylamino group, a tertiary alkylamino group, and a quaternary ammonium salt group.

5. The photoelectric conversion element of claim 1, further comprising a layer overlying the electron transport layer, the layer including a low-molecular-weight amine compound represented by the following formula (4):

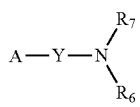

Formula (4)

wherein each of $R_6$ and $R_7$ independently represents an alkyl group having 1 to 4 carbon atoms or benzyl group, while $R_6$ and $R_7$ may share bond connectivity to form a ring; Y represents a divalent aromatic group having 6 to 14 carbon atoms or an alkylene group having 1 to 4 carbon atoms; and A represents one of the following substituents

—COOH

—P(=O)(OH)$_2$

—Si(OH)$_3$.

6. The photoelectric conversion element of claim 1, wherein the first material includes at least one of the following Compounds 9, 12, or 14:

Compound 9

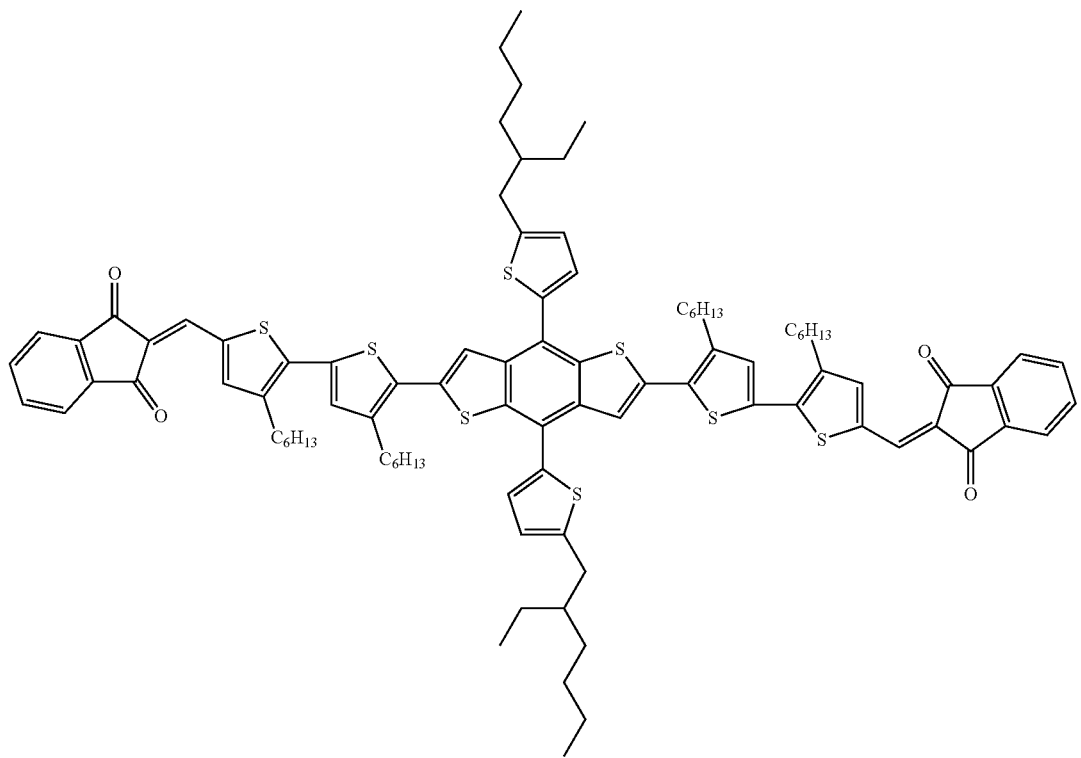

-continued
Compound 12
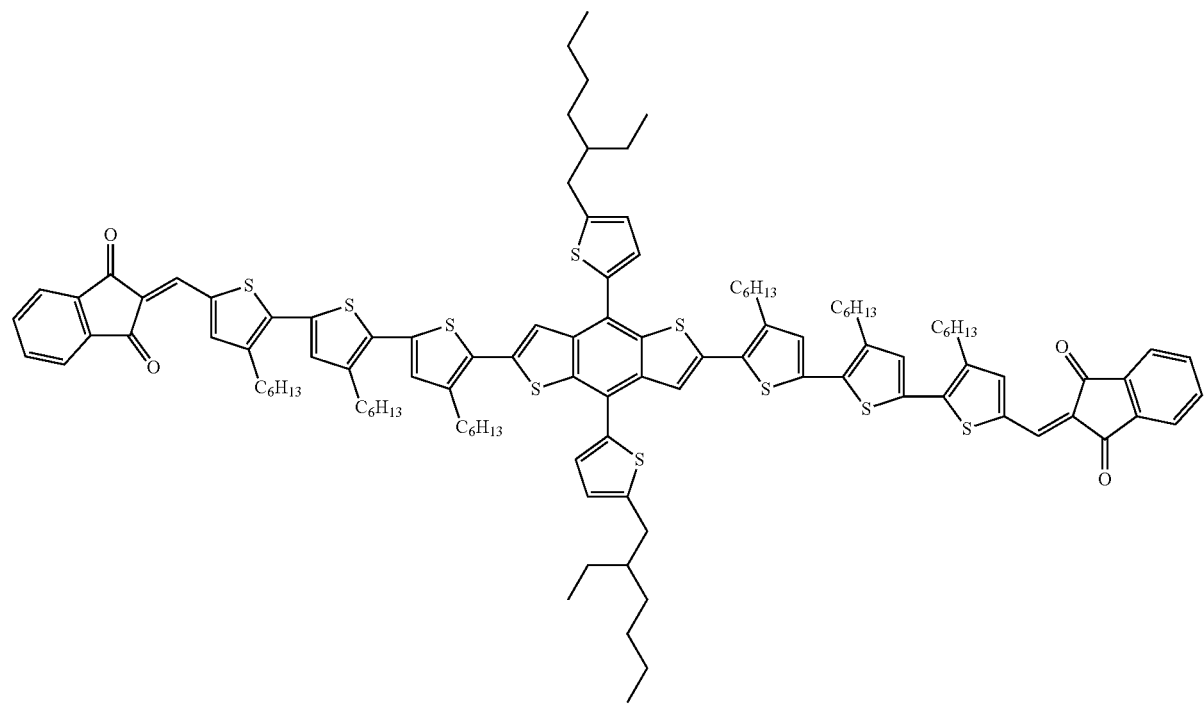
Compound 14
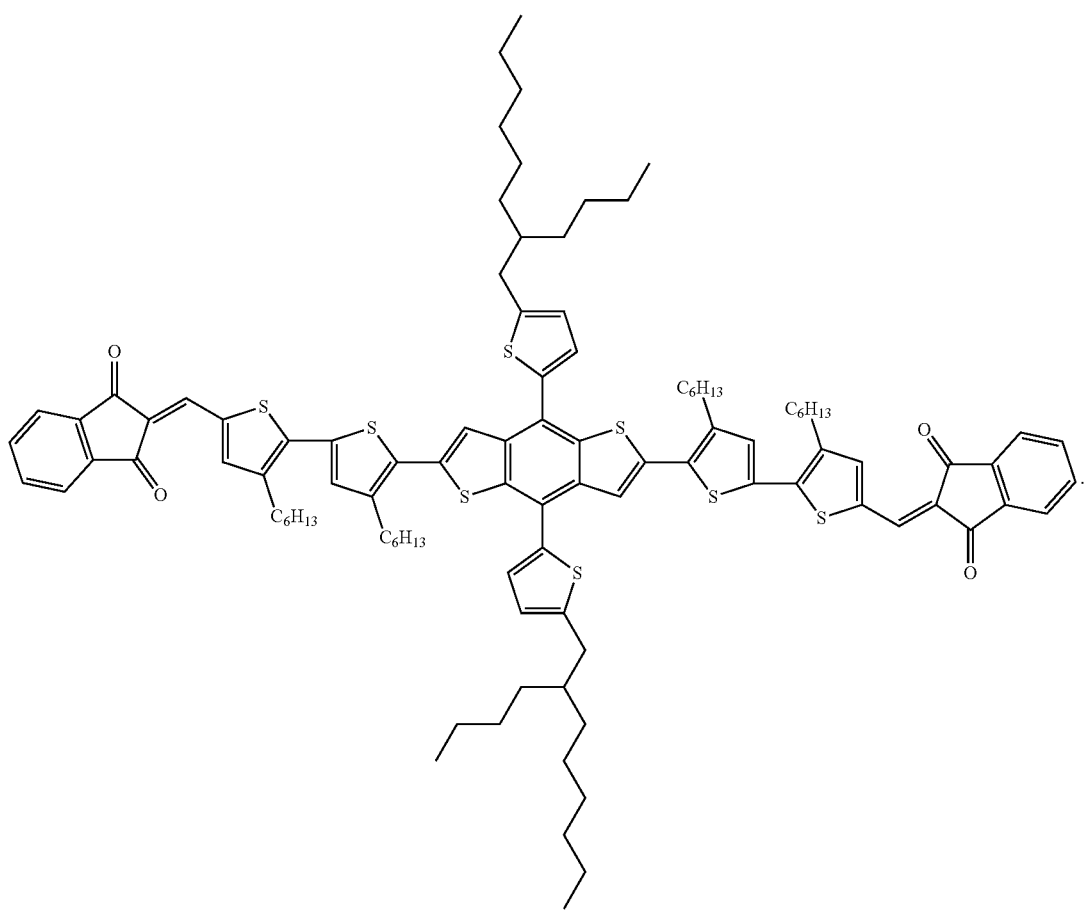
* * * * *